(12) United States Patent
Schadewald, Jr. et al.

(10) Patent No.: US 6,894,879 B2
(45) Date of Patent: May 17, 2005

(54) DISC DRIVE SHUNTING DEVICE

(75) Inventors: Frank William Schadewald, Jr., Bloomington, MN (US); Arnold Warren Johansen, Marlboro, MA (US)

(73) Assignee: Seagate Technology LLC, Scotts Valley, CA (US)

( * ) Notice: Subject to any disclaimer, the term of this patent is extended or adjusted under 35 U.S.C. 154(b) by 44 days.

(21) Appl. No.: 10/021,956

(22) Filed: Dec. 17, 2001

(65) Prior Publication Data

US 2002/0075610 A1 Jun. 20, 2002

Related U.S. Application Data

(60) Provisional application No. 60/256,139, filed on Dec. 15, 2000.

(51) Int. Cl.[7] .................................................. G11B 5/40
(52) U.S. Cl. ........................................................ 360/323
(58) Field of Search .............................. 360/323, 245.8, 360/234.5; 361/212; 438/455

(56) References Cited

U.S. PATENT DOCUMENTS

| 4,761,699 | A | * | 8/1988 | Ainslie et al. ........... 360/234.5 |
| 5,710,682 | A | * | 1/1998 | Arya et al. .............. 360/245.8 |
| 5,963,415 | A | * | 10/1999 | Johansen .................... 361/212 |
| 5,991,134 | A | | 11/1999 | Tan et al. ..................... 361/56 |
| 6,219,202 | B1 | | 4/2001 | Palmer .................... 360/234.5 |
| 6,301,087 | B1 | * | 10/2001 | Combe ....................... 360/323 |
| 6,335,263 | B1 | * | 1/2002 | Cheung et al. ............. 438/455 |
| 6,507,467 | B1 | * | 1/2003 | Schadewald et al. ....... 360/323 |
| 6,512,664 | B1 | * | 1/2003 | Smith et al. ................ 361/212 |

FOREIGN PATENT DOCUMENTS

JP            11025416 A    *   1/1999

* cited by examiner

Primary Examiner—Tianjie Chen
(74) Attorney, Agent, or Firm—Paul T. Dietz

(57) ABSTRACT

An electrostatic discharge protection device can protect a head gimbal assembly circuit from electrostatic discharge. The device includes a housing and a shunt positioned within the housing. The shunt includes a pair of electrical contacts and the shunt has a first position in which the electrical contacts are in electrical communication with the circuit and a second position in which the electrical contacts are removed from electrical communication with the circuit. The shunt can be placed in its first position to protect the head gimbal assembly against electrostatic discharge and is moved into its second position to permit testing operations of the head gimbal assembly. The shunt is then returned to its first position.

13 Claims, 8 Drawing Sheets

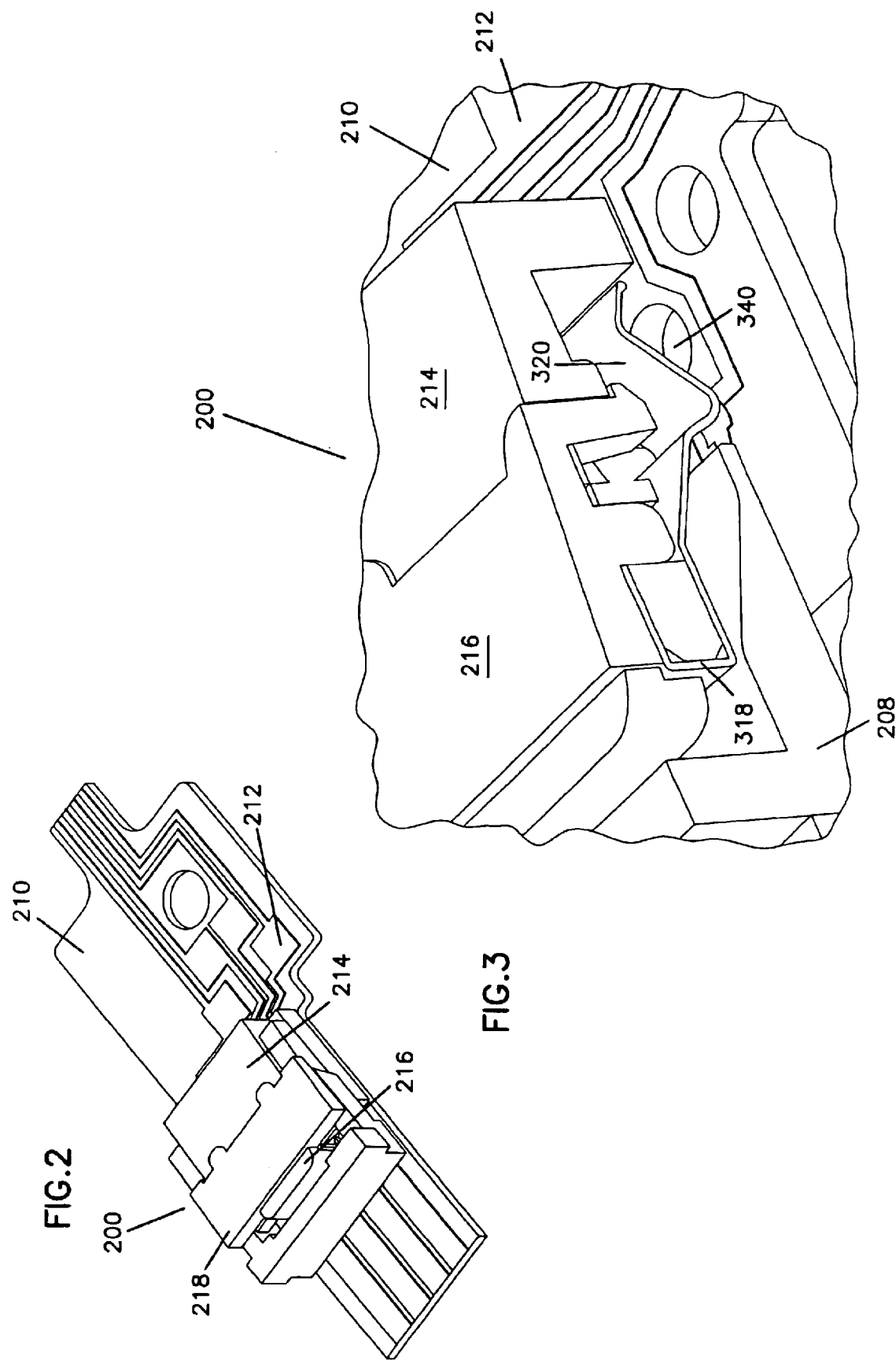

DISC DRIVE SHUNTING DEVICE

CROSS REFERENCE TO RELATED APPLICATIONS

This application claims the benefit of U.S. Provisional Application Ser. No. 60/256,139, filed Dec. 15, 2000 entitled "SHUNTING DEVICE FOR HARD DRIVE HGA's", which application is incorporated by reference herein.

FIELD OF THE INVENTION

The invention relates generally to disc drives and more specifically to disc drives having head gimbal assemblies. In particular, the invention relates generally to structure and methods of protecting electronic components such as head gimbal assemblies from electrostatic discharge.

BACKGROUND OF THE INVENTION

Rotating disc magnetic recording systems typically employ magnetic head transducers which glide over the magnetic disc media on a cushion of air. The mounting or support structure which carries the transducers are termed "sliders." Sliders have air-bearing surfaces that are propelled off the surface of moving media by boundary air which moves with the media disc. The air-bearing surface of a slider is aerodynamically designed to glide on the boundary air due to a pattern of raised rails and recesses which establish the "fly height" of the slider. Read/write transducers are mounted on the rear side of the slider, with the reader sensor and writer gap at the air-bearing surface, facing the moving media.

A slider assembly typically includes a ceramic slider and associated read/write heads, a support flexure arm, interconnection wires between the heads and external signaling devices, and any associated mounting hardware. The slider assembly is mounted on an arm which is movable over the surface of a rotating magnetic disc to position the slider adjacent selected tracks on the disc. Disc drives usually employ multiple discs which rotate together, spaced apart from one another on a single spindle. One slider assembly is provided for each magnetic recording surface in a disc drive.

In magnetic disc drive data storage devices, digital data are written to and read from a thin layer of magnetizable material on a surface of one or more rotating discs. Write and read operations are performed through the write and read transducers. The slider and transducers are sometimes collectively referred to as a head, and typically a single head is associated with each disc surface. When the read transducer is a magnetoresistive (MR) type sensor, the combination of the slider and the transducer are frequently referred to as a MR head. The head is selectively moved under the control of electronic circuitry to any one of a plurality of circular, concentric data tracks on the disc surface by an actuator device. Each slider body includes an air bearing surface (ABS). As the disc rotates, the disc drags air beneath the ABS, which develops a lifting force that causes the head to lift and fly above the disc surface.

As with many electronic elements, a slider assembly, also known as a head gimbal assembly, is sensitive to electrostatic discharge that can result from electrostatic charges accumulating on a surface of the slider assembly. The most common sources of electrostatic charges in the production, testing and use of disc drive components such as head gimbal assemblies are humans and machines. Electrostatic discharge is a particular issue when testing head gimbal assemblies.

When the charge becomes sufficiently strong to overcome the insulating properties of any materials that are between the charged surface and another surface having a lower electrical potential, an electrostatic discharge occurs. As is well known in the art, electrostatic discharges can be devastating to electronic components, which is why for example individuals who install or replace circuit boards within a PC are often instructed to ground themselves to a metal surface within the chassis of the PC.

As disc drives progress in terms of storage space and access speed, they become increasingly sensitive to electrostatic discharge, and they become increasingly sensitive to electrostatic discharge occurring at ever decreasing voltages. A need remains for structure and methods of protecting electronic elements such as head gimbal assemblies from electrostatic discharge.

The present invention provides a solution to this and other problems, and offers other advantages over the prior art.

SUMMARY OF THE INVENTION

According to a first aspect of the present invention, there is provided an electrostatic discharge protection device for protecting a head gimbal assembly circuit from electrostatic discharge. The device includes a housing and a shunt positioned within the housing. The shunt includes a pair of electrical contacts and the shunt has a first position in which the electrical contacts are in electrical communication with the circuit and a second position in which the electrical contacts are removed from electrical communication with the circuit.

According to another aspect of the present invention, there is provided a method of protecting a head gimbal assembly from electrostatic discharge. A shunt is provided with a pair of electrical contacts and has a first position in which the electrical contacts are in electrical communication with the head gimbal assembly and a second position in which the electrical contacts are not in electrical communication with the head gimbal assembly. The shunt is placed in its first position to protect the head gimbal assembly against electrostatic discharge and is moved into its second position to permit testing operations of the head gimbal assembly. The shunt is then returned to its first position.

In accordance with another aspect of the present invention, there is provided an electrostatic discharge protection device that includes means for electrically communicating with a circuit to be protected and means for reversibly shorting a portion of the circuit to be protected.

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

FIG. 2 is a perspective view of an electrostatic discharge protection device according to a preferred embodiment of the present invention.

FIG. 3 illustrates a portion of the electrostatic discharge protection device of FIG. 2, with the device shown in its shunted position.

DETAILED DESCRIPTION OF THE PRESENTLY PREFERRED EMBODIMENTS

The following description is a detailed description of the preferred embodiments presently contemplated for carrying out the present invention. This description is made for the purpose of illustrating the general principles of the present invention and is not meant to limit the inventive concepts claimed herein.

Figure 1:
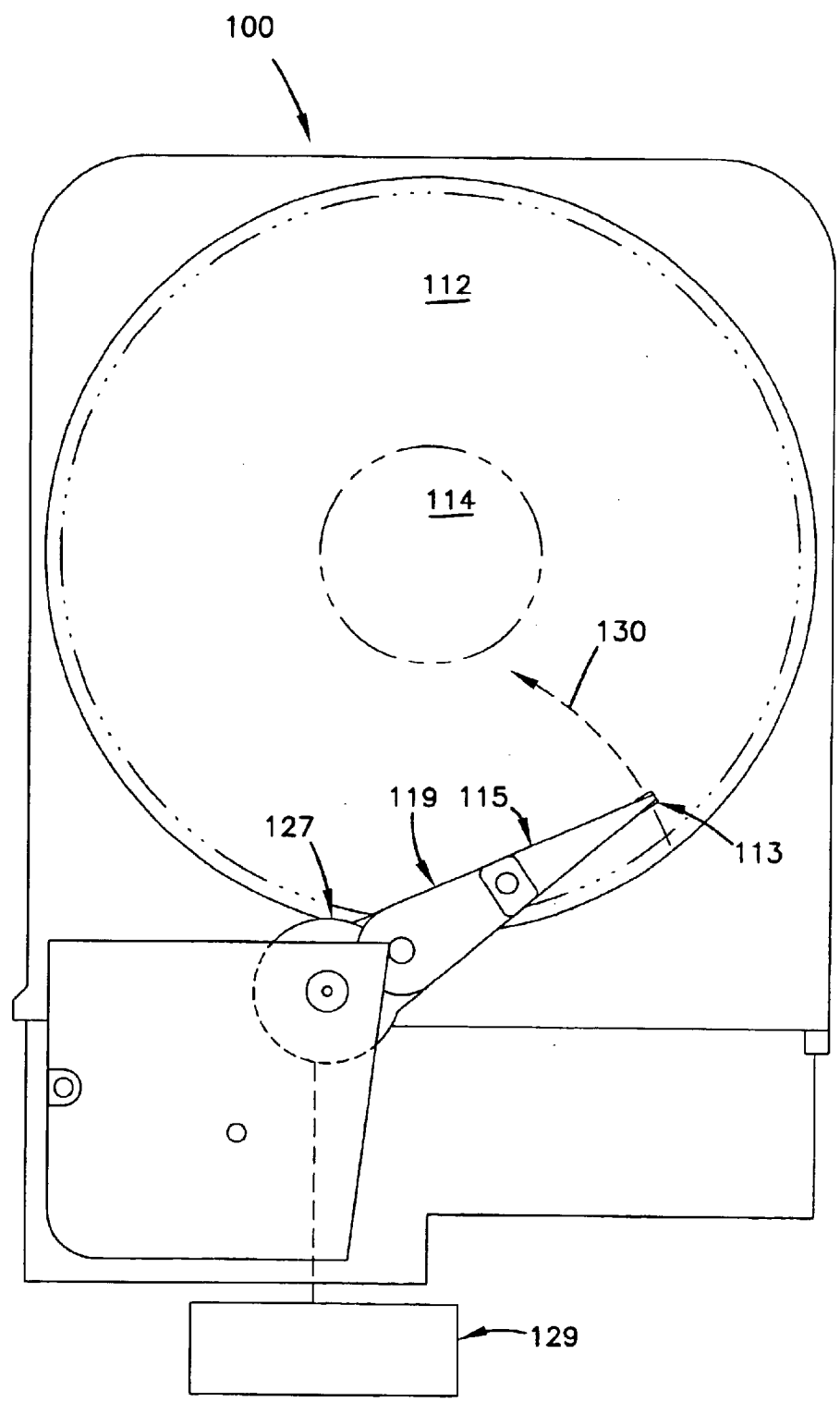
FIG. 1 is a simplified schematic drawing of a magnetic recording disc system.

FIG. 1 is a simplified schematic diagram of a disc drive system 100 embodying the present invention. As shown in FIG. 1, at least one rotatable magnetic disc 112 is supported on a spindle 114 and rotated by a disc drive motor. The magnetic recording media on each disc is in the form of an annular pattern of concentric data tracks (not shown) on disc 112.

At least one slider 113 is positioned on the disc 112, each slider 113 supporting one or more magnetic read/write heads incorporating the present invention. As the discs 112 rotate, slider 113 is moved radially in and out as shown by arrow 130 over the disc surface so that the heads located on the slider 113 may access different portions of the disc where desired data is either recorded or written to. Each slider 113 is attached to an actuator arm 119 by a suspension 115. The suspension 115 provides a slight spring force which biases the slider 113 against the disc surface. Each actuator arm 119 is attached to an actuator 127.

During operation of the disc storage system, the rotation of disc 112 generates an air bearing between an air bearing surface (ABS) on the slider 113 and the disc 112. The ABS is the surface of slider 113 which faces the surface of the disc. The air bearing exerts an upward force or lift on the slider 113. The air bearing thus counter-balances the slight spring force of suspension 115 and supports the slider 113 slightly above the disc 112 surface by a small, substantially constant spacing during normal operation.

The various components of the disc storage system are controlled in operation by control signals generated by a drive controller 129, such as access control signals and internal clock signals. Typically, the drive controller 129 includes logic control circuits, storage and a microprocessor. The drive controller 129 generates control signals to control various system operations such as drive motor control signals and head position and seek control signals. The control signals provide the desired current profiles to optimally move and position slider 113 to the desired data track on disc 112 as is well known.

The above description of a typical magnetic disc storage system, and the accompanying illustration of FIG. 1 are for representation purposes only. It should be apparent that disc storage systems may contain a large number of discs and actuators, and each actuator may support a number of sliders.

FIGS. 2 through 5 illustrate an electrostatic discharge protection device in accordance with a particular embodiment of the present invention. FIG. 2 in particular is a perspective view of an electrostatic discharge protection device 200, seen mounted to a printed circuit board 210. A conductive pattern 212 is formed on a surface of the printed circuit board 210. The electrostatic discharge protection device 200 includes a two-part housing formed from elements 214 and 216, as well as a shuttle 208. The electrostatic discharge protection device 200 also includes a cover plate 218. The printed circuit board 210 can be part of a disc drive assembly, or it can also be part of a testing apparatus used for testing various parts of a disc drive such as a head gimbal assembly. The housing of the electrostatic discharge protection device 200 can be configured to snap onto the printed circuit board 210.

The electrostatic discharge protection device 200 also includes a conductor 318 (FIG. 3). A portion of the conductor 318 forms a contact 320 that is in spring contact with the conductive pattern 212 formed on the surface of the printed circuit board 210. Each of the conductors 318 (only one is seen in the illustrated view) is in electrical communication with a shunt that provides a low resistance between each of the conductors 318.

As illustrated for example in FIG. 3, the electrostatic discharge protection device 200 can be placed in a position in which the contacts 320 of the conductors 318 are in electrical communication with the conductive pattern 212 that is present on the printed circuit board 210. In particular, the shuttle 208 is positioned such that the contacts 320 are in spring contact with the conductive pattern 212. The conductors 318 can be configured such that the contacts 320 are biased in this position, thereby providing a limited resistance of less than about 0.1 ohms across the conductive pattern 212 when desired. The electrostatic discharge protection device 200 can protect against electrostatic discharges that are in a range of about 2 to 5 volts.

The shunt that includes the contacts 320 of the conductive elements 318 can be configured to be manually moved between its first position and its second position. The shunt can also be configured to be automatically moved between its first position and its second position.

Figure 4:
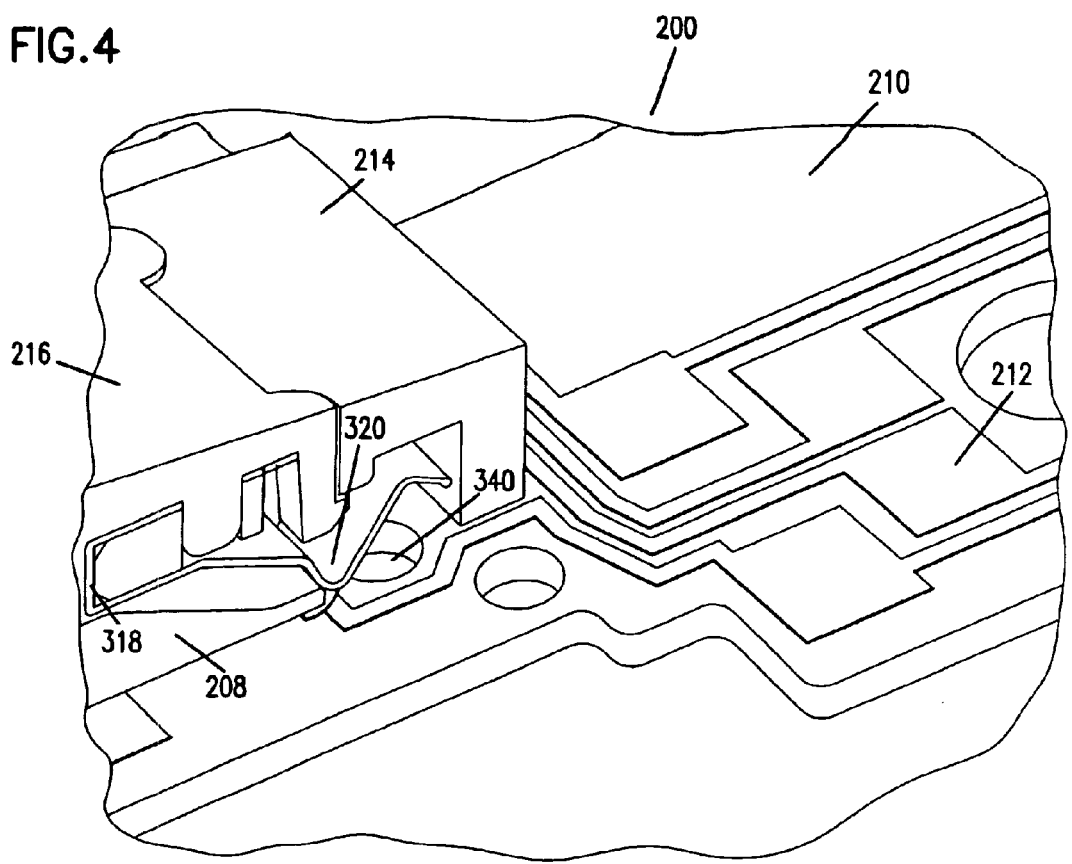
FIG. 4 illustrates a portion of the electrostatic discharge protection device of FIG. 2, with the device shown in an alternate deshunted position.

FIG. 4 illustrates the electrostatic discharge protection device 200 in a position in which the contacts 320 are not in electrical communication with the conductive pattern. In this position, the shuttle 208 has been moved forward, which physically lifts the contacts 320 up away from the conductive pattern 212. In this position, the electrostatic discharge protection device 200 is not in electrical communication with the printed circuit board 210 and thus provides no influence on whichever circuit is represented by the conductive pattern 212. The shuttle 208 can be moved manually, although it is considered that a mechanical testing apparatus can also serve to move the shuttle 208 between its shunted and unshunted positions.

In a particular embodiment, the conductive pattern 212 can represent, separately, the reading and writing circuits for a head gimbal assembly. Thus, the electrostatic discharge protection device 200 can be used to reversibly protect either the reading and/or writing circuits. In particular, the shunt can be configured to provide a limited resistance between the electrical contacts that are in electrical communication with the head gimbal assembly's reader circuit. The shunt can further provide a limited resistance between the electrical contacts that are in electrical communication with the head gimbal assembly's writer circuit. The electrical contacts 320 that are part of the shuttle 208 can be configured as bifurcated pairs of electrical contacts.

Figure 5:
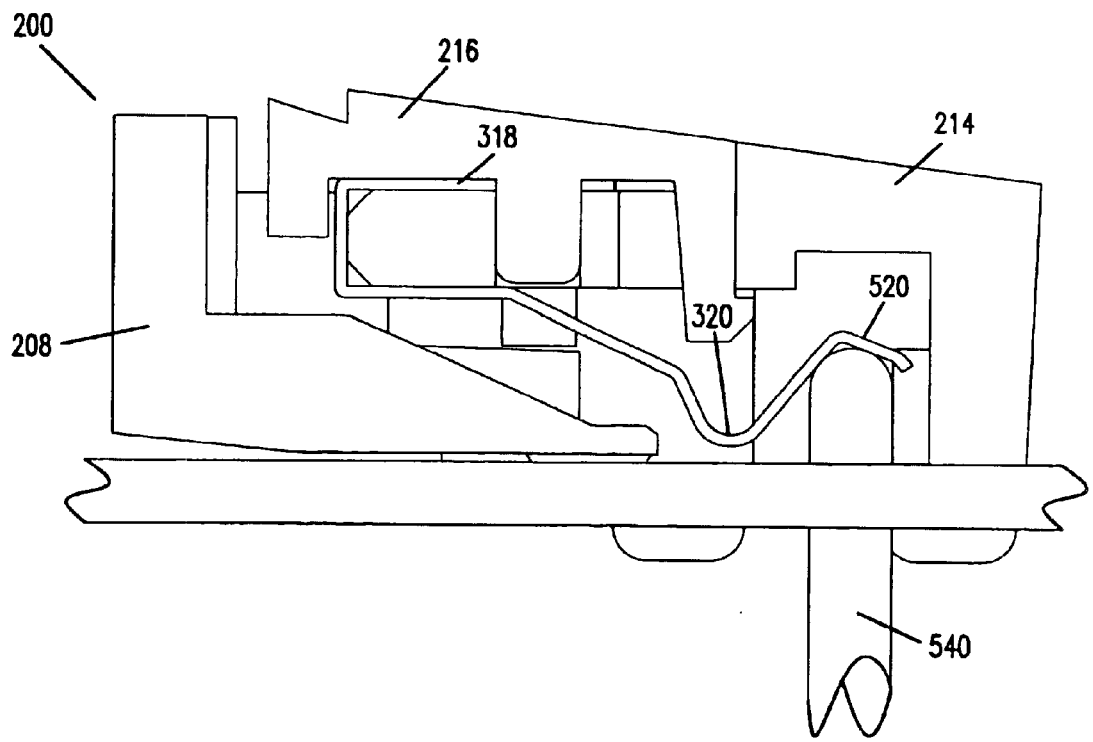
FIG. 5 illustrates a portion of the electrostatic discharge protection device of FIG. 2, with the device shown in a deshunted position.

Even if the shuttle 208 is in its shunted position (as seen for example in FIG. 3), the electrostatic discharge protection device 200 can still be adjusted such that the contacts 320 can be reversibly lifted from contact with the conductive pattern 212. FIG. 5 illustrates the positioning of a deshunting or tester pin 540 that can be inserted for example through an aperture 340 in the printed circuit board 210 (as seen in FIGS. 3 and 4). The tester pin 540 contacts a portion 520 of the conductor 320, thereby lifting the contact 320 from the conductive pattern 212 and electrically decoupling the contact 320 from the conductive pattern 212. It is considered that while the tester pin 540 (only one seen in this view) can be inserted manually, it is preferred that the tester pin 540 be part of a mechanical testing apparatus that can shunt and deshunt the conductive pattern 212 as necessary for whichever particular testing procedure is being observed.

Figure 6:
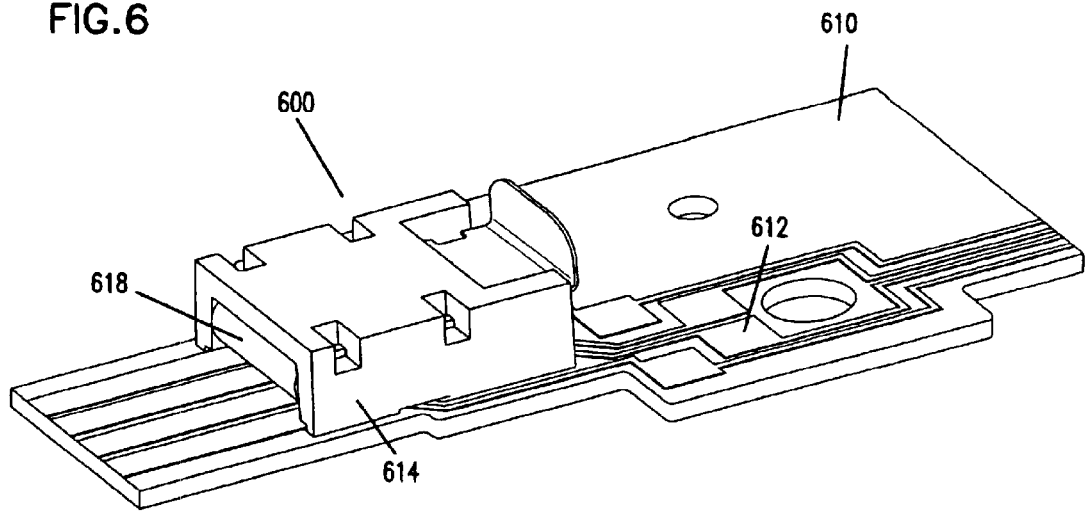
FIG. 6 shows an electrostatic discharge protection device in accordance with a preferred embodiment of the present invention, with the device installed on a printed circuit board.

FIGS. 6 through 12 illustrate an electrostatic discharge protection device 600 in accordance with another preferred embodiment of the present invention. In FIG. 6, the electrostatic protection device 600 includes a housing 614 and a conductor 618. The electrostatic protection device 600 is mounted onto a printed circuit board 610 that bears a conductive pattern 612.

Figure 7:
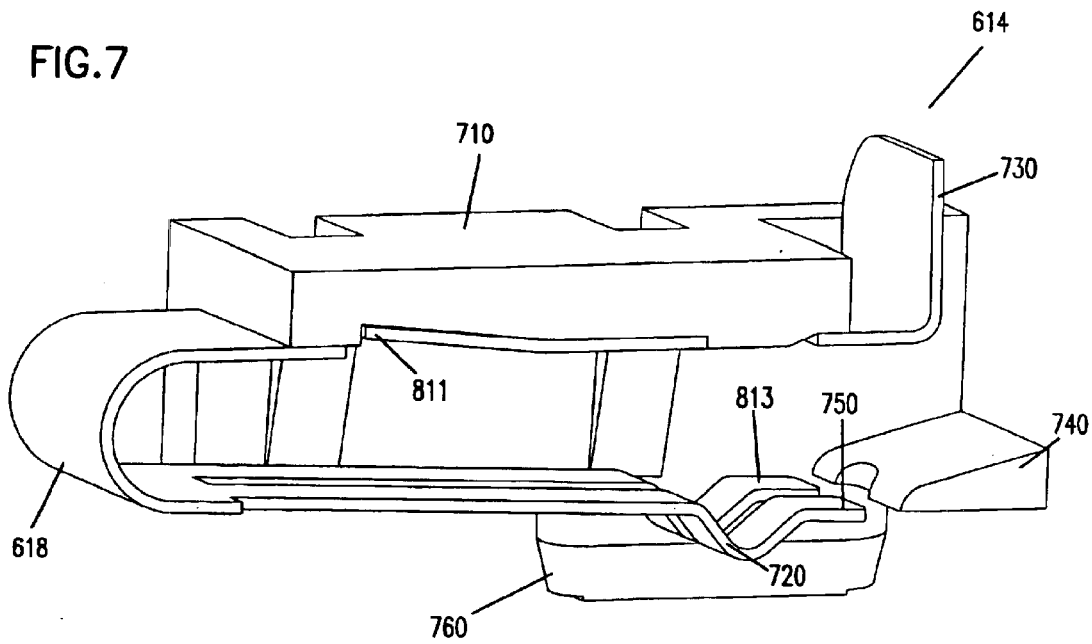
FIG. 7 is a side elevation of an electrostatic discharge protection device in accordance with a preferred embodiment of the present invention.
Figure 8:
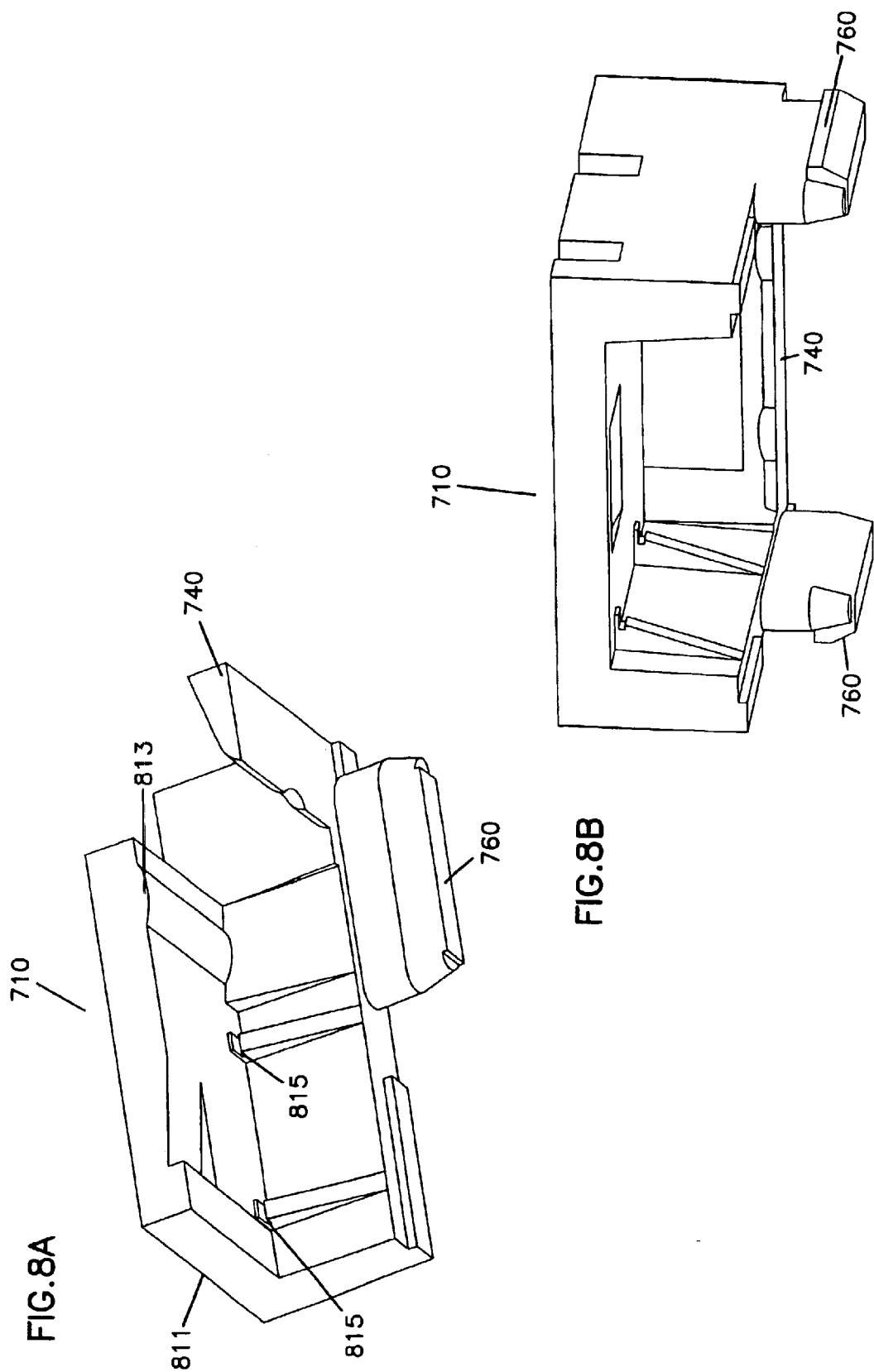
FIGS. 8A and 8B are perspective views of a housing utilized in the electrostatic discharge protection device of FIG. 6.

The housing 614 is better illustrated in FIG. 7, which shows a cross-sectional view of the housing 614. The housing 614 includes a body 710 that can be made from any non-conductive material such as plastic. A conductor or shunt 618 is provided within the body 710 and has an exterior lever 730 that can be used to move the shunt 618 from a position in which the contacts 720 can be in electrical communication with the conductive pattern 612 (as seen in FIG. 6) to a position in which the contacts 720 are not in electrical communication with the conductive pattern 612. As illustrated in FIG. 7, the shunt 618 is seen in its default, shunted position.

The shunt 618 can be moved into a non-shunted position by pulling backward on the lever 730, which forces the leading edge 750 of the shunt 618 up onto the deshunting rail 740. As the leading edge 750 of the shunt 618 progresses further up the deshunting rail 740, the contacts 720 move vertically upward and thus are removed from electrical communication with the conductive pattern 612. The deshunting rail 740 can be configured to accept and support a portion of the pair of electrical contacts when the shunt is in its second position. The deshunting rail 740 can be configured to lift the pair of electrical contacts so that electrical communication between the shunt and the circuit is broken.

As illustrated for example in FIGS. 8A and 8B, the body 710 includes a shunt lock 811 that provides a terminus for the shunt 618 and serves to limit the distance the shunt 618 can travel within the body 710. A detent 813 is positioned within the body 710 to provide a noticeable default position and to help prevent accidental movement of the shunt 618. The shunt 618 is guided in part by four rails 815 (only two are seen in the illustrated cross-sectional view) that are formed within the body 710 of the housing 714. Finally, the body 710 includes latching structures 760 that serve to anchor the electrostatic discharge protection device 600 to the printed circuit board 610.

Figure 9:
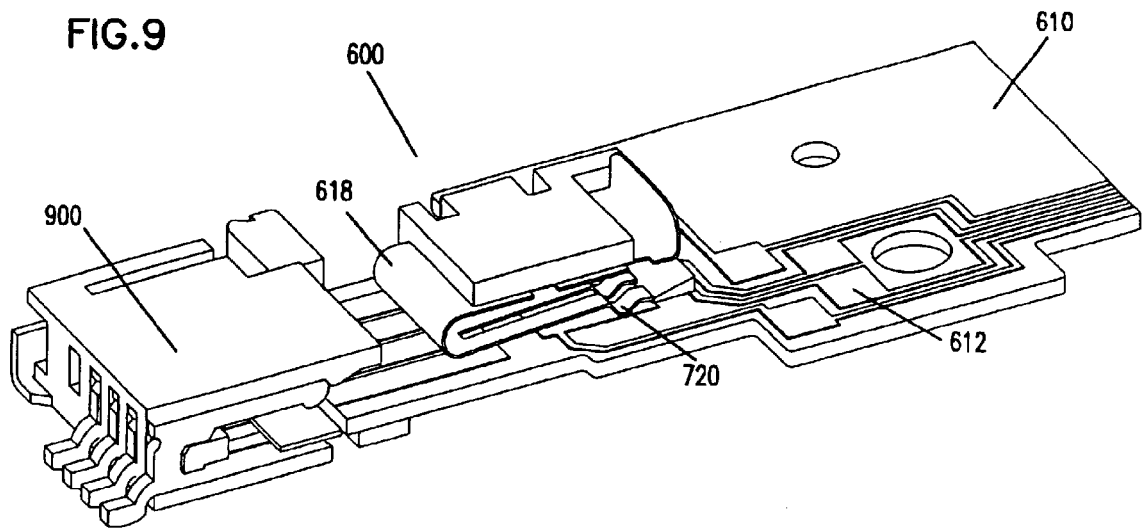
FIG. 9 illustrates a shunted printed circuit board bearing an electrostatic discharge protection device in accordance with a preferred embodiment of the present invention, illustrating the initial placement of a connector block.
Figure 10:
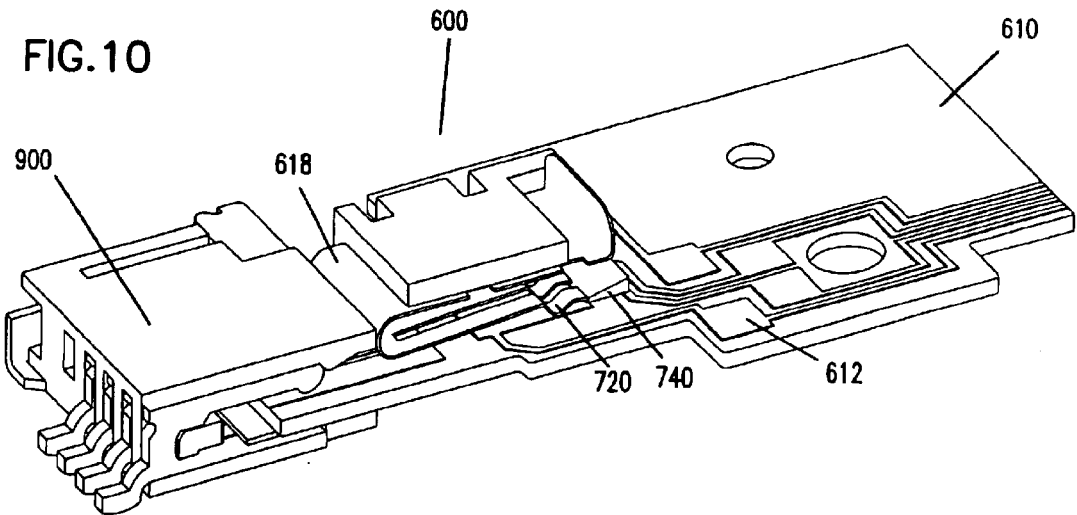
FIG. 10 illustrates the shunted printed circuit board bearing an electrostatic discharge protection device of FIG. 9, showing the connector block in contact with the electrostatic discharge protection device.
Figure 11:
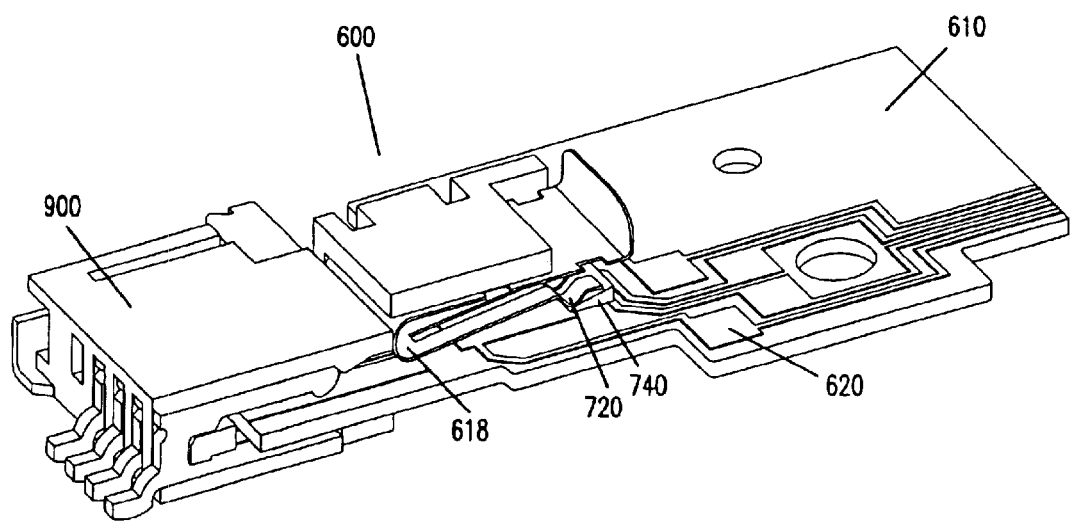
FIG. 11 illustrates the printed circuit board bearing an electrostatic discharge protection device of FIG. 9, showing the connector block fully inserted and the electrostatic discharge protection device in a deshunted position.
Figure 12:
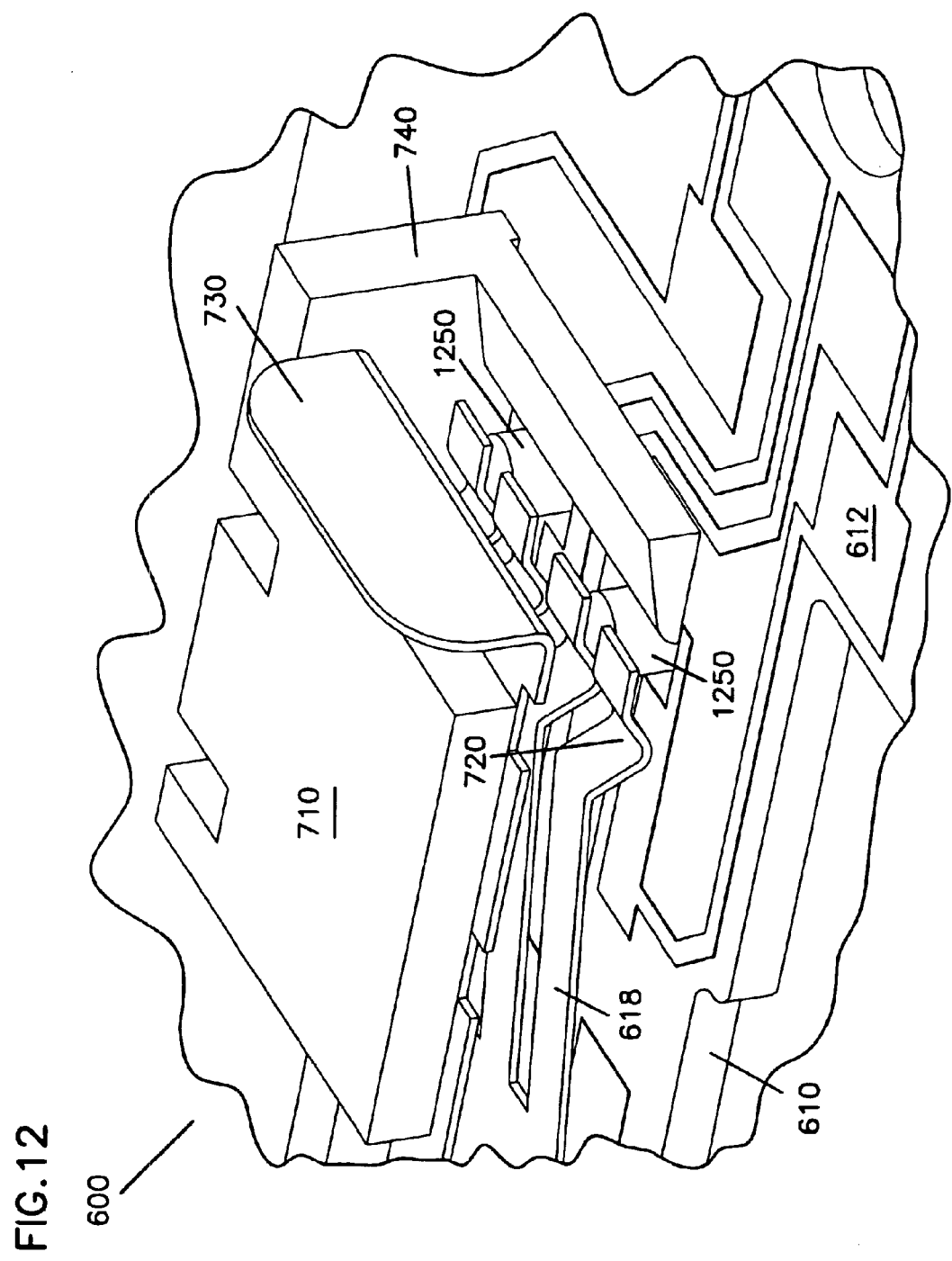
FIG. 12 is an illustration of the electrostatic discharge protection device of FIG. 6, showing both the deshunting rail and the test pins.

FIGS. 9, 10, and 11 illustrate a use of the electrostatic discharge protection device 600 in conjunction with a connector block 900. The connector block 900 can be part of a disc drive assembly or can also be part of a testing apparatus. FIG. 9 shows an electrostatic discharge protection device 600 in a shunted position atop the conductive pattern 612 of the printed circuit board 610. The connector block 900 is positioned adjacent to the printed circuit board 610. In FIG. 10, the connector block 900 has moved and is just in contact with the electrostatic discharge protection device 600 which remains in its shunted position. In FIG. 11, the connector block 900 has moved sufficiently to push the electrostatic discharge protection device 600 into an unshunted position in which the contacts 720 have moved forward and upward onto the deshunting rail 740 and therefore are no longer in electrical communication with the conductive pattern 612. The electrostatic discharge protection device 600 can also be moved into an unshunted position by using test pins 1250, as seen in FIG. 12.

In summary, the invention involves an electrostatic discharge protection device 200 for protecting a head gimbal assembly circuit. The device 200 includes a housing and a shunt or conductor 318 positioned within the housing. The shunt 318 includes a pair of electrical contacts 320 and has a first position in which the electrical contacts 320 are in electrical communication with the circuit 212 and a second position in which the electrical contacts 320 are removed from electrical communication with the circuit 212. The shunt 318 is reversibly moveable between the first position and the second position.

The shunt 318 can provide a limited resistance between the electrical contacts 320 when the shunt 318 is in its first position and in particular can provide a resistance of less than about 0.1 ohms. In particular, the electrostatic discharge protection device 200 can protect against electrostatic discharges that are between about 2 and 5 volts.

The electrostatic discharge protection device 200 can include a deshunting rail 740 that is configured to accept and support the pair of electrical contacts 320 when the shunt 318 is in its second position. The deshunting rail 740 can lift the pair of electrical contacts 320 so that electrical communication between the shunt 318 and the circuit 212 is broken.

The electrostatic discharge protection device 200 can also include a connector block 900 that includes a deshunting pin 1250 that is reversibly moveable from a shunted position in which the pair of electrical contacts 320 are in electrical communication with the circuit 212 to an unshunted position in which the pair of electrical contacts 320 are not in electrical communication with the circuit 212.

The shunt 318 can be configured to protect a head gimbal assembly printed circuit board 210 by providing a limited resistance between the electrical contacts 320 that are in electrical communication with the head gimbal assembly's reader circuit and providing a short between the head gimbal assembly's writer circuit.

The electrostatic discharge protection device 200 can include a housing that is configured to snap onto a printed circuit board 210. The shunt 318 can be configured to be manually moved between its first position and its second position or it can be configured to be automatically moved between its first position and its second position.

An assembly can include a connector block 900 and an electrostatic discharge protection device 200. The connector block 900 can be configured to cooperate with the electrostatic discharge protection device 200 such that the connector block 900 functions to reversibly move the shunt 318 from a first position to a second position. In particular, bringing the connector block 900 into contact with a printed circuit board 21-can physically move the shunt 318 from its first position to its second position. Removing the connector block can permit the shunt to return to its first position.

The invention also involves a method of protecting a head gimbal assembly from electrostatic discharge. A shunt 318 can be provided that includes a pair of electrical contacts 320 and that has a first position in which the electrical contacts 320 are in electrical communication with the head gimbal assembly and a second position in which the electrical contacts 320 are not in electrical communication with the head gimbal assembly. The shunt 318 can be placed in its first position to protect the head gimbal assembly against electrostatic discharge, moved into its second position to permit testing operations, and then can be moved back to its first position.

In particular, the shunt 318 can be moved into its second position without introducing any electrical product variations.

The invention also involves an electrostatic discharge protection device 200 that includes means to electrically communicate with a circuit to be protected and also includes means to reversibly short a portion of the circuit to be protected.

The means to electrically communicate with the circuit to be protected can include a shunt 318 comprising a pair of electrical contacts 320 that are moveable from a first position in which the electrical contacts 320 are in electrical communication with the circuit 212 to be protected to a second position in which the electrical contacts 320 are not in electrical communication with the circuit 212 to be protected. The means to reversibly short a portion of the circuit 212 to be protected can include one of a deshunting rail 740 and a deshunting pin 540.

While the invention has been described with reference to specific embodiments, it will be apparent to those skilled in the art that many alternatives, modifications and variations may be made. Accordingly, the present invention is intended to embrace all such alternatives, modifications and variations that may fall within the spirit and scope of the appended claims.

We claim:

1. An electrostatic discharge protection device for protecting a head gimbal assembly circuit from electrostatic discharge, the device comprising:
   a housing; and
   a shunt positioned within the housing, the shunt comprising a pair of electrical contacts, the shunt having a first position within the housing in which the electrical contacts are in electrical communication with the circuit and a second position within the housing in which the electrical contacts are not in electrical communication with the circuit;
   wherein the shunt can be reversibly moved between the first position and the second position.

2. The electrostatic discharge protection device of claim 1, wherein the device can be used in a head gimbal assembly testing apparatus.

3. The electrostatic discharge protection device of claim 1, wherein the shunt provides a limited resistance of less than about 0.1 ohms between the electrical contacts when the shunt is in its first position.

4. The electrostatic discharge protection device of claim 1, wherein the shunt protects against electrostatic discharges that are between about 2 and 5 volts.

5. The electrostatic discharge protection device of claim 1, further comprising a deshunting rail that is configured to accept and support a portion of the pair of electrical contacts when the shunt is in its second position.

6. The electrostatic discharge protection device of claim 5, wherein the deshunting rail is configured to lift the pair of electrical contacts so that electrical communication between the shunt and the circuit is broken.

7. The electrostatic discharge protection device of claim 1, further comprising a deshunting pin that is reversibly removable from a shunted position in which the pair of electrical contacts are in electrical communication with the circuit to an unshunted position in which the pair of electrical contacts are not in electrical communication with the circuit.

8. The electrostatic discharge protection device of claim 1, wherein the shunt is configured to protect a head gimbal assembly and the shunt provides a limited resistance between the electrical contacts that are in electrical communication with the head gimbal assembly's reader circuit.

9. The electrostatic discharge protection device of claim 8, wherein the shunt further provides a limited resistance between the electrical contacts that are in electrical communication with the head gimbal assembly's writer circuit.

10. The electrostatic discharge protection device of claim 1, wherein the housing is configured to snap onto a printed circuit board.

11. An electrostatic discharge protection device comprising:
    means for electrically communicating with a circuit to be protected; and
    at least one of a deshunting rail and a deshunting pin for reversibly shorting a portion of the circuit to be protected by lifting the means for electrically communicating relative to the circuit during operation of the device so as to electrically separate the means for electrically communicating and the circuit, and returning the means for electrically communicating from the lifted position relative to the circuit to a position in which the means for electrically communicating and the circuit are electrically connected.

12. The electrostatic discharge protection device of claim 11, wherein the means for electrically communicating with the circuit to be protected comprises a shunt having a pair of electrical contacts that are moveable from a first position in which the electrical contacts are in electrical communication with the circuit to be protected to a second position in which the electrical contacts are not in electrical communication with the circuit to be protected.

13. An electrostatic discharge protection device comprising:
    means for electrically communicating with a circuit to be protected; and
    means for reversibly shorting a portion of the circuit to be protected comprising one of a deshunting rail and a deshunting pin.

* * * * *